United States Patent
Ou

(10) Patent No.: US 11,452,221 B2
(45) Date of Patent: Sep. 20, 2022

(54) LATCH MECHANISM

(71) Applicant: Getac Technology Corporation, Hsinchu County (TW)

(72) Inventor: Po-Yi Ou, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 1015 days.

(21) Appl. No.: 16/157,210

(22) Filed: Oct. 11, 2018

(65) Prior Publication Data
US 2020/0120818 A1 Apr. 16, 2020

(51) Int. Cl.
| | | |
|---|---|---|
| H05K 5/02 | (2006.01) | |
| F16B 2/22 | (2006.01) | |
| H01M 50/209 | (2021.01) | |
| G06F 1/16 | (2006.01) | |
| H05K 5/00 | (2006.01) | |

(52) U.S. Cl.
CPC ............ *H05K 5/0221* (2013.01); *F16B 2/22* (2013.01); *G06F 1/1635* (2013.01); *H01M 50/209* (2021.01); *H01M 2220/30* (2013.01); *H05K 5/0086* (2013.01)

(58) Field of Classification Search
CPC ...... H05K 5/0221; H05K 5/0086; F16B 2/22; G06F 1/1635; H01M 50/209; H01M 2220/30; Y02E 60/10
See application file for complete search history.

(56) References Cited

U.S. PATENT DOCUMENTS

| | | | | |
|---|---|---|---|---|
| 8,348,358 B2* | 1/2013 | Huang | .................... | G06F 1/181 312/223.2 |
| 8,367,238 B2* | 2/2013 | Chang | ................. | H04M 1/0262 429/96 |
| 8,531,823 B2* | 9/2013 | Ho | ........................ | G06F 1/1635 361/679.01 |
| 9,502,701 B1* | 11/2016 | Annerino | ............ | H01M 50/209 |
| 9,930,797 B1* | 3/2018 | Liu | ........................ | H05K 5/0221 |
| 2003/0035265 A1* | 2/2003 | DeLuga | ................. | G06F 1/1616 361/679.58 |
| 2004/0214077 A1* | 10/2004 | Huang | ................. | H01M 50/209 429/97 |
| 2008/0291641 A1* | 11/2008 | Sheng | .................... | G06F 1/1658 361/726 |

(Continued)

*Primary Examiner* — James Wu
*Assistant Examiner* — Sagar Shrestha
(74) *Attorney, Agent, or Firm* — Locke Lord LLP; Tim Tingkang Xia, Esq.

(57) ABSTRACT

A latch mechanism includes an elastic piece, a positioning member and an operation member. The elastic piece has a positioning end and an immobile end fixed at a sliding member. The positioning member has a positioning portion. The operation member is provided at the positioning member. The positioning end is pressingly secured at the positioning portion to block a linear sliding movement of the sliding member. The operation member is slid to push the elastic piece and drive the positioning end to depart the positioning portion, further allowing the linear sliding movement of the sliding member. The latch mechanism prevents a battery from being accidentally separated from an electronic device caused by an impact or falling off of the electronic device.

11 Claims, 10 Drawing Sheets

(56) References Cited

U.S. PATENT DOCUMENTS

| | | | |
|---|---|---|---|
| 2012/0039025 A1* | 2/2012 | Chen | H01M 50/20 |
| | | | 292/179 |
| 2012/0052355 A1* | 3/2012 | Chiang | H01M 50/244 |
| | | | 429/96 |
| 2013/0044420 A1* | 2/2013 | Iwamoto | G06F 1/1656 |
| | | | 361/679.01 |
| 2017/0179448 A1* | 6/2017 | Hsu | H02J 7/0044 |
| 2017/0294632 A1* | 10/2017 | Liao | H01M 50/244 |
| 2019/0124782 A1* | 4/2019 | Nihei | H05K 5/03 |

* cited by examiner

LATCH MECHANISM

BACKGROUND OF THE INVENTION

Field of the Invention

The present invention relates to a latch mechanism.

Description of the Prior Art

In electronic devices of the prior art, such as tablet computers and laptop computers, to make the replacement of a battery easier for a user, a battery latch that can be opened and closed is often installed near the battery so as to facilitate the removal and installation of the battery. However, if the electronic device is accidentally fallen during the utilization process, the battery latch is often shifted when the electronic device impacts the ground and the battery then becomes disengaged from the electronic device, resulting in interrupted power of the electronic device. Such sudden power interruption frequently causes damage in the operating system or data in the electronic device.

The section "description of the prior art" is used for assisting in understanding of the contents of the present invention, and thus the disclosure in the "description of the prior art" may include details that do not constitute certain prior art generally known to a person skilled in the art. Further, the disclosure of the "description of the prior art" neither represents the problems to be solved by the disclosure or one or more embodiments of the present invention, nor means that the art of the present invention is already known to a person skilled in the art before the application of the present invention.

SUMMARY OF THE INVENTION

The present invention provides a latch mechanism capable of preventing a battery from being accidentally separated from an electronic device due to an impact or falling off of the electronic device.

In one embodiment of the present invention, a latch mechanism provided by the present invention includes a sliding member, an elastic piece, a positioning member and an operation member. The elastic piece has a positioning end and an immobile end fixed at the sliding member. The positioning member has a positioning portion. The operation member is provided at the positioning member. The positioning end is pressingly secured at the positioning portion to block a linear sliding movement of the sliding member. The operation member is slid to push the elastic piece and drive the positioning end to depart from the positioning portion, further allowing the linear sliding movement of the sliding member.

In one embodiment of the present invention, a latch mechanism provided by the present invention is suitable for limiting a movement of a sliding member, and includes a positioning member, an elastic piece and an operation member. The positioning member has a positioning portion, a first limiting portion and a second limiting portion. The positioning portion faces the sliding member, and the first limiting portion and the second limiting portion are adjacent to the positioning portion. The elastic piece has an immobile end, a positioning end, and a connecting section obliquely connecting the immobile end and the positioning end. The immobile end is provided on the sliding member. The operation member is provided on the positioning member and has a pushing portion, which is located at one end of the connecting section close to the positioning member. The positioning end is pressingly secured on the positioning portion and the operation member is located at the first limiting position, such that relative positions of the sliding member and the positioning member are fixed. When the operation member slides from the first limiting portion to the second limiting portion, the pushing portion pushes the connecting section such that the connecting section moves towards a direction away from the positioning member and drives the positioning end to depart from the positioning portion, thus enabling the sliding member to slide relative to the positioning member.

In one embodiment of the present invention, a latch mechanism provided by the present invention is suitable for locking a battery of an electronic device in a battery installation portion of the electronic device, and includes a sliding member, a positioning member, an elastic piece and an operation member. The sliding member has a second fastening portion and a mounting portion. The second fastening portion is fastened with a first fastening portion of the battery so as to lock the battery in the battery installation portion. The mounting portion is adjacent to the second fastening portion. The positioning member is positioned correspondingly to the mounting portion, and has a positioning portion, a first limiting portion and a second limiting portion. The positioning portion faces the mounting portion, and the first limiting portion and the second limiting portion are adjacent to the positioning portion. The elastic piece is provided between the mounting portion and the positioning portion, and has an immobile end, a positioning end, and a connecting section obliquely connecting the immobile end and the positioning end.

The immobile end is provided on the mounting portion. The operation member is provided on the positioning portion, and has a pushing portion that is located at one side of the connecting section close to the positioning member. The positioning end is pressingly secured on the positioning portion and the operation member is located at the first limiting portion, such that the relative positions of the first fastening portion and the second fastening portion are fixed. When the operation member slides from the first limiting portion to the second limiting portion, the pushing portion pushes the connecting section, such that the connecting section moves towards a direction away from the positioning member and drives the positioning end to depart from the positioning portion, further enabling the sliding member to slide relative to the positioning member and causing the second fastening portion to depart from the first fastening portion.

In a latch mechanism of the present invention, the operation member needs to slide on the positioning member and push the elastic piece to cause the positioning end of the elastic piece to depart from the positioning portion of the positioning member, in order to allow the sliding member to slide. When the latch mechanism of the present invention is applied to a battery of an electronic device, the battery can be removed from a battery installation portion of the electronic device only when the sliding member is in a sliding state. As such, when the electronic device impact or falls onto the ground while in a state where the positioning end is pressingly secured at the positioning portion, the battery does not depart from the battery installation portion. Therefore, the latch mechanism of the present invention ensures that the battery is not separated from the electronic device due to an impact or falling off of the electronic device, thereby preventing the issue of interrupted power supply caused by an accidental disengagement of the battery, as well as effectively reducing the risk of damaging the operation system or data.

To better understand the above and other objects, features and advantages of the present invention, details of the present invention are given in in the embodiments with the accompanying drawings below.

DETAILED DESCRIPTION OF THE EMBODIMENTS

Figure 1:
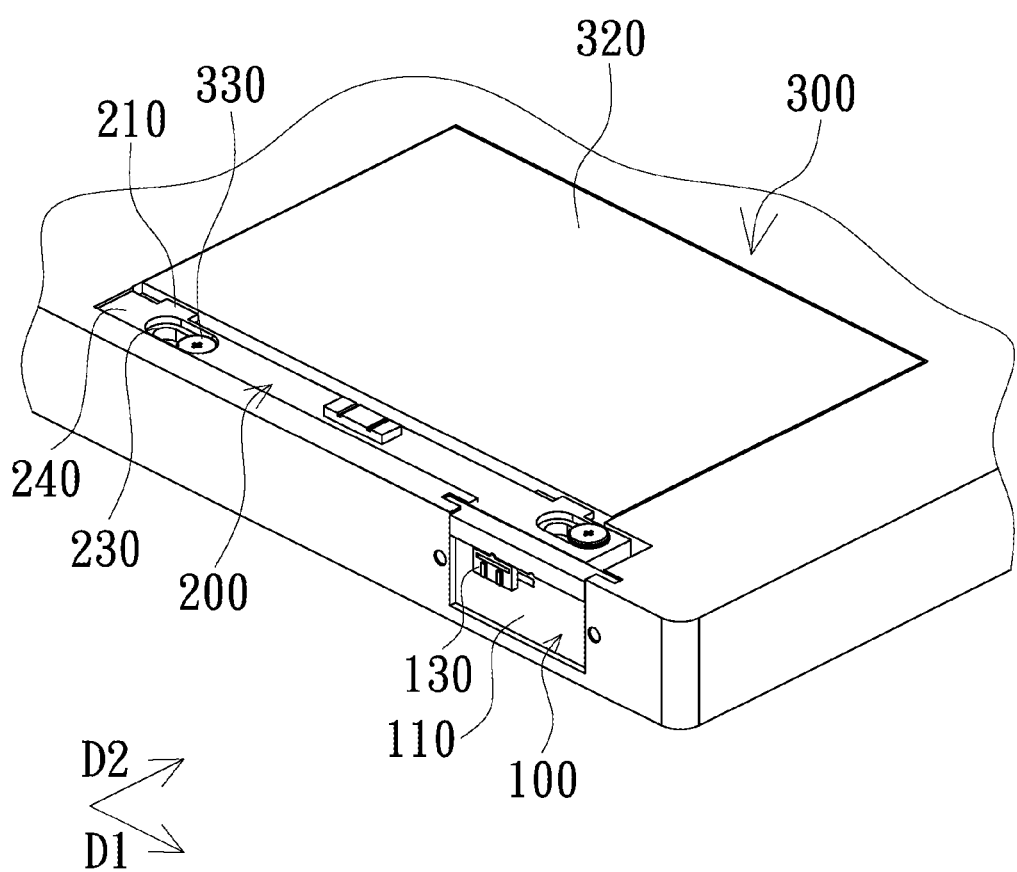
FIG. 1 is a schematic diagram of a latch mechanism applied to an electronic device and being in a locked state according to an embodiment of the present invention.
Figure 2:
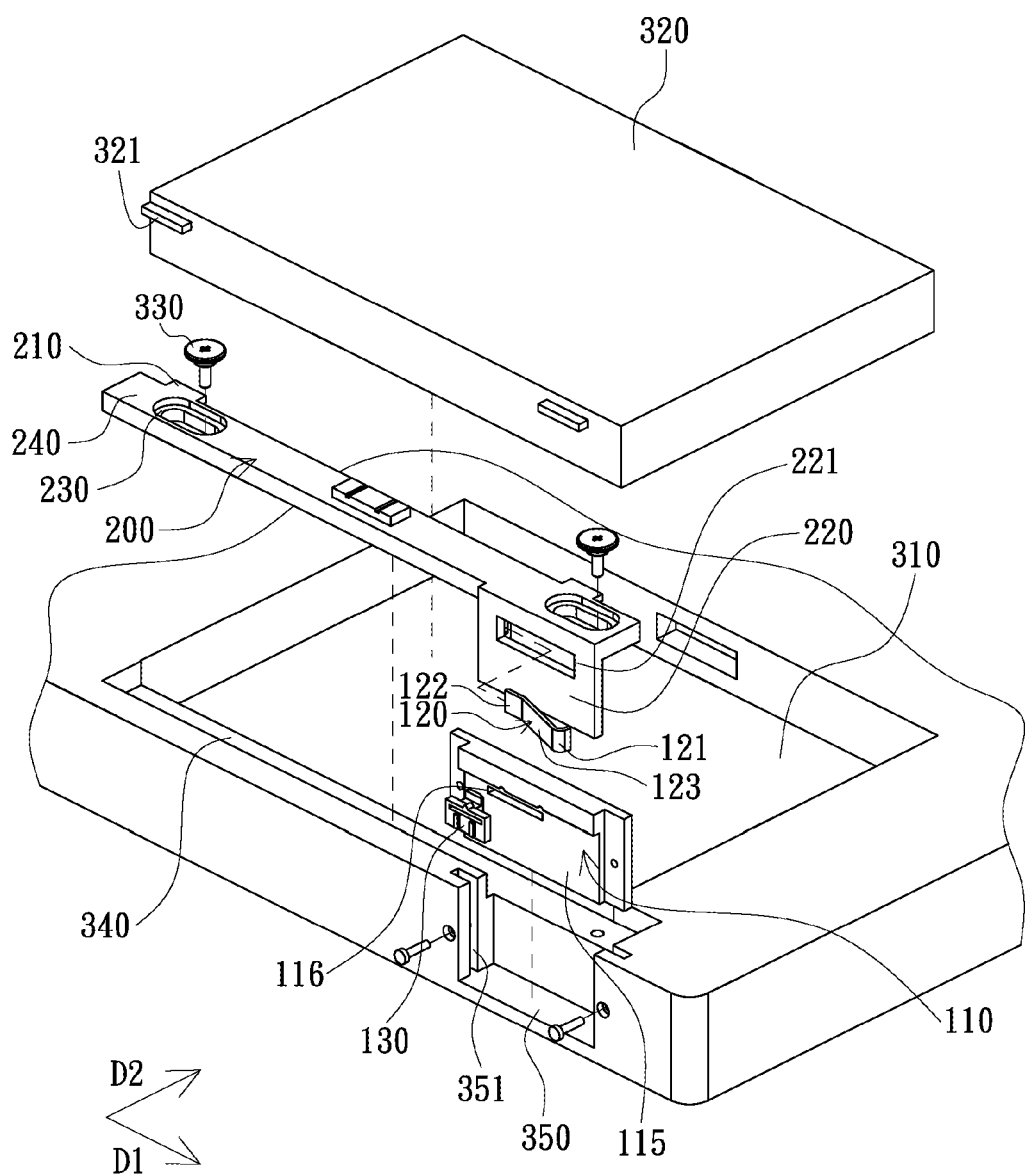
FIG. 2 is a front perspective exploded diagram of FIG. 1.
Figure 3:
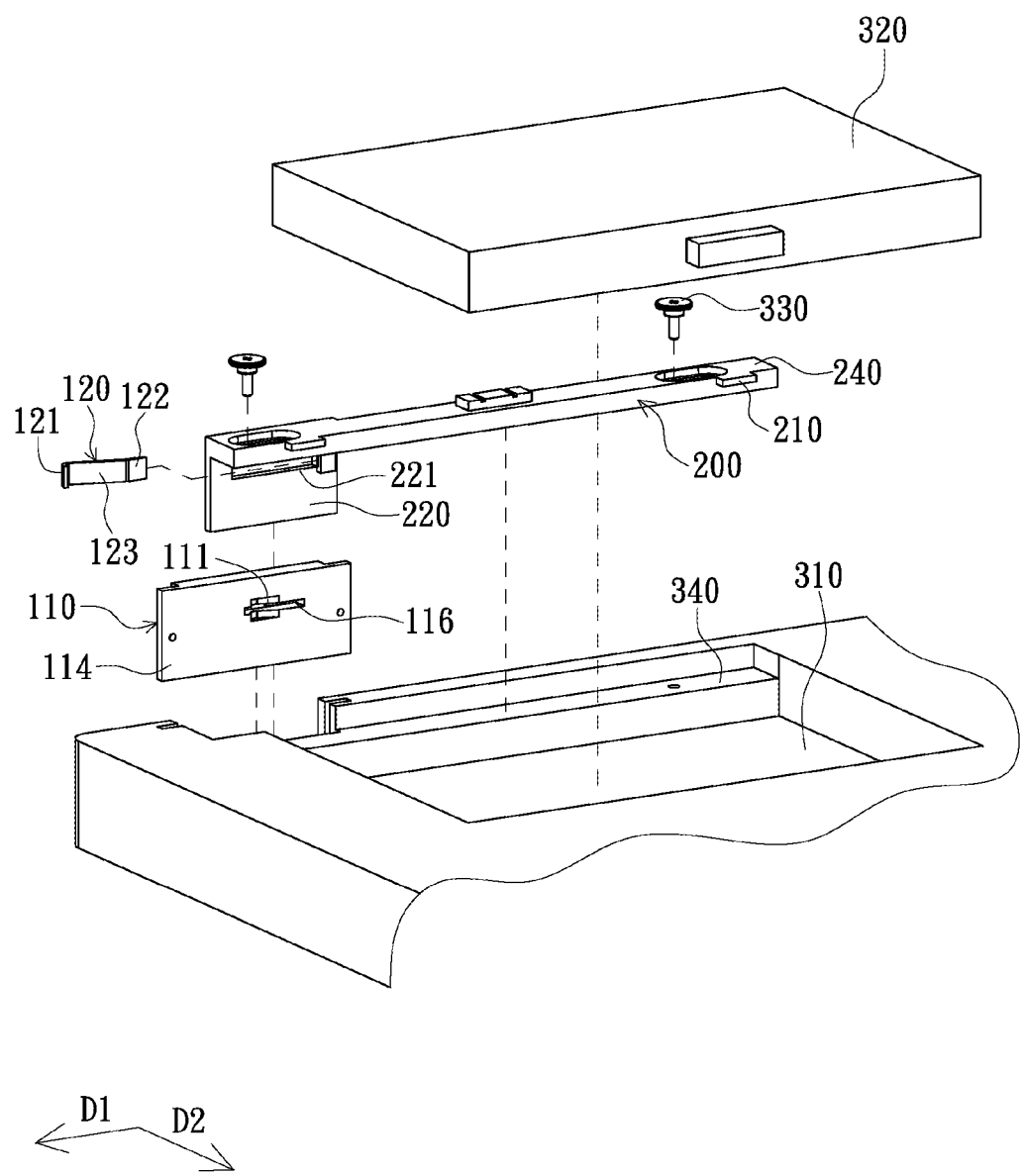
FIG. 3 is a rear perspective exploded diagram of FIG. 1.
Figure 4:
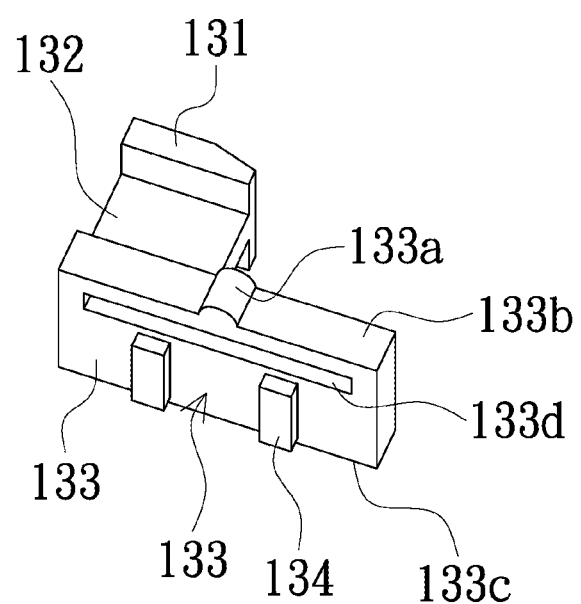
FIG. 4 is a perspective appearance diagram of an operation member of a latch mechanism according to an embodiment of the present invention.
Figure 5A:
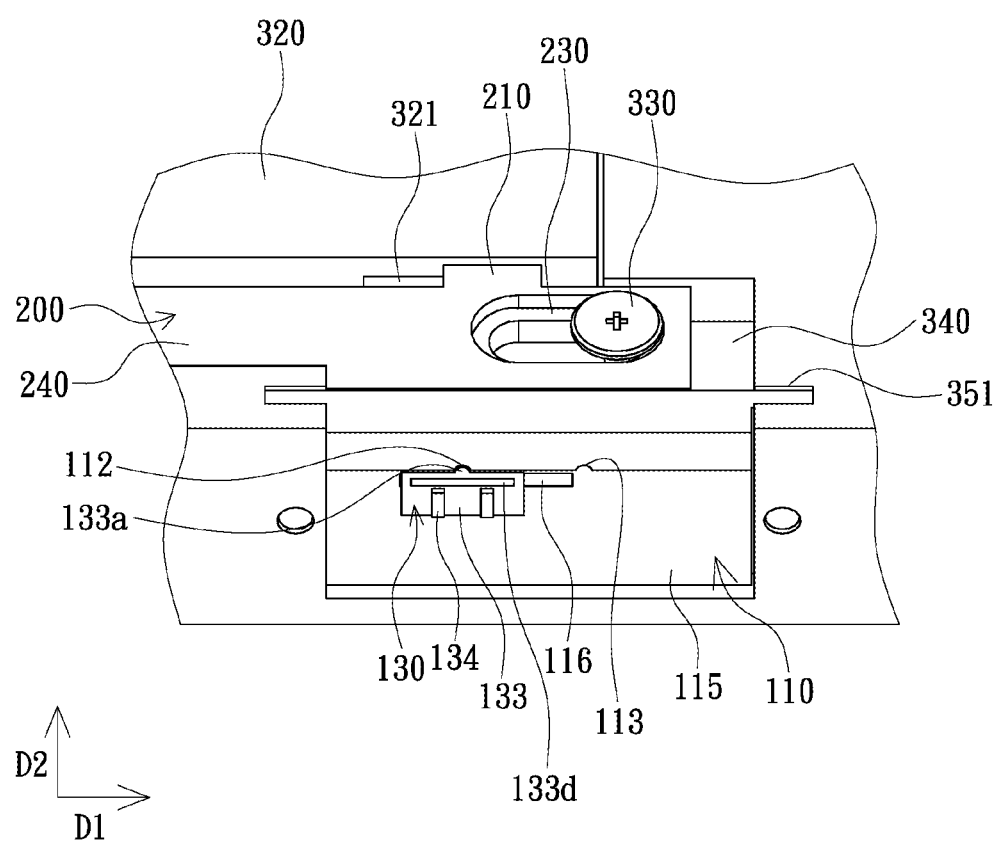
FIG. 5A is an enlarged partial view of FIG. 1.
Figure 5B:
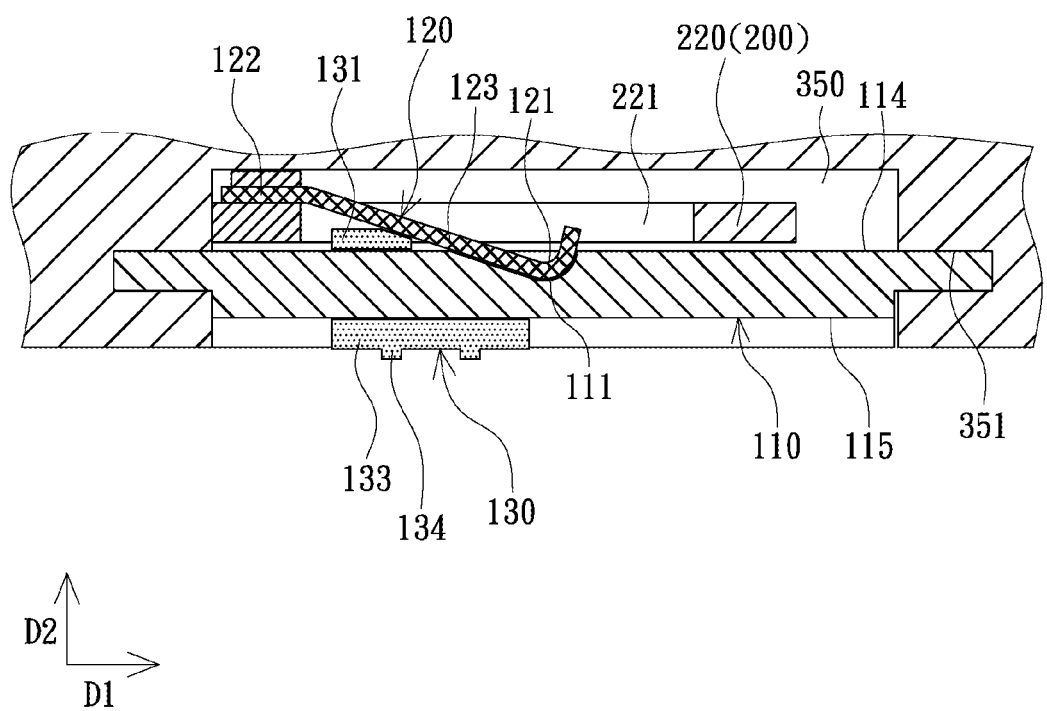
FIG. 5B is a top section diagram of FIG. 5A.

FIG. 1 shows a schematic diagram of a latch mechanism applied to an electronic device and being in a locked state according to an embodiment of the present invention. FIG. 2 is a front perspective exploded diagram of FIG. 1. FIG. 3 is a rear perspective exploded diagram of FIG. 1. FIG. 4 is a perspective appearance diagram of an operation member of a latch mechanism according to an embodiment of the present invention. FIG. 5A is an enlarged partial view of FIG. 1. FIG. 5B is a top section diagram of FIG. 5A. Referring to FIG. 1 to FIG. 5B, a latch mechanism 100 of the embodiment includes a positioning member 110, an elastic piece 120 and an operation member 130. The positioning member 110 has a positioning portion 111. The elastic piece 120 has a positioning end 121 and an immobile end 122. The immobile end 122 of the elastic piece 120 is provided on a sliding member 200. The operation member 130 is provided at the positioning member 110. The positioning end 121 is pressingly secured at the positioning portion 111 to block the sliding member 200 to linearly slide along a first direction D1. By sliding the operation member 130, the operation member 130 pushes the elastic piece 120 and drives the positioning end 121 to depart along a second direction D2 from the positioning portion 111, further allowing the sliding member 200 to slide linearly.

Figure 6A:
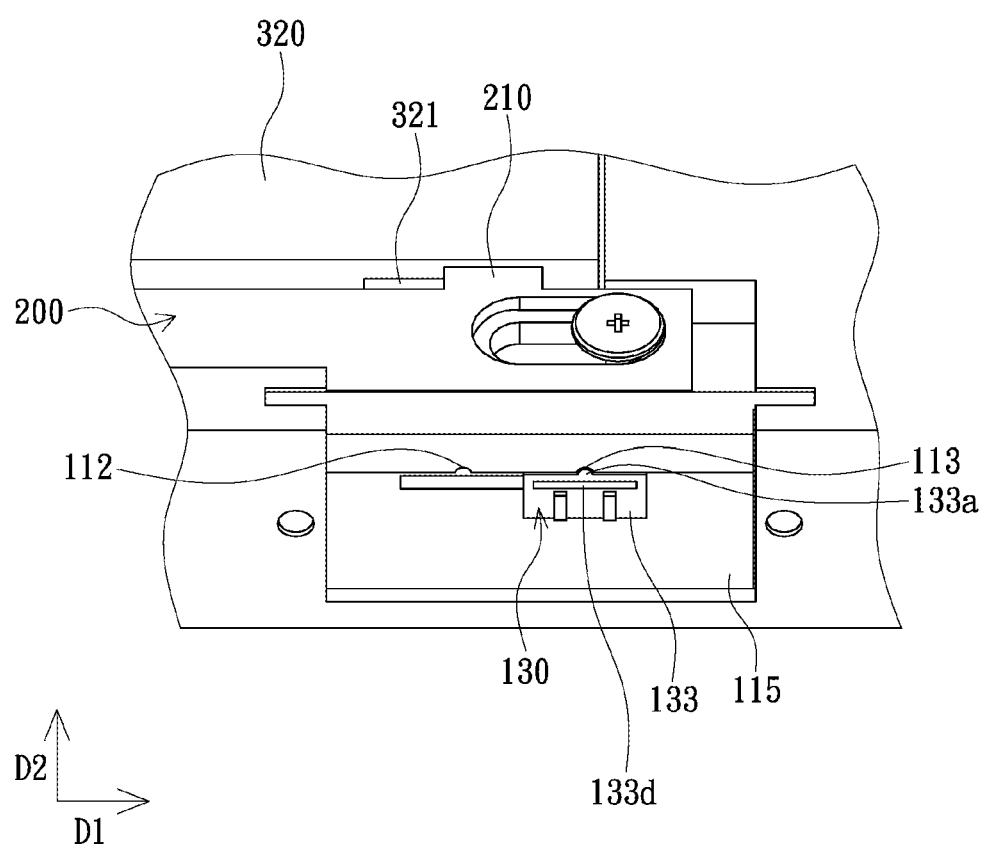
FIG. 6A is a first schematic diagram of a latch mechanism applied to an electronic device and being in an unlocked state according to an embodiment of the present invention.
Figure 6B:
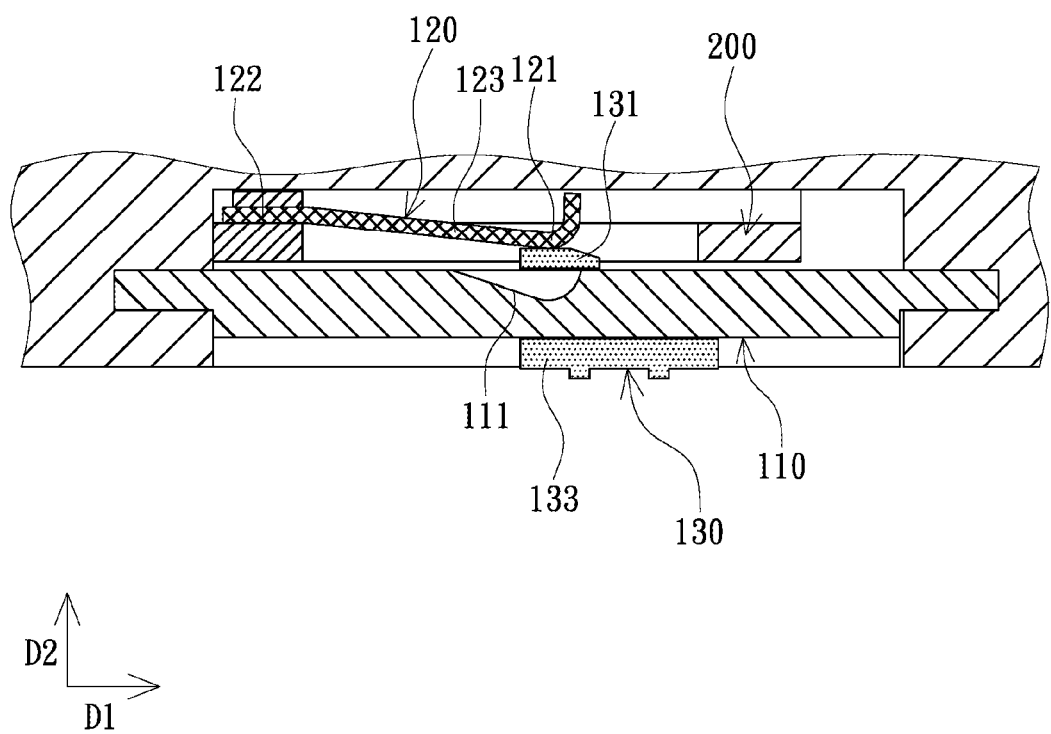
FIG. 6B is a top section diagram of FIG. 6A.

FIG. 6A shows a first schematic diagram of a latch mechanism applied to an electronic device and being in an unlocked state according to an embodiment of the present invention. FIG. 6B shows an upper section diagram of FIG. 6A. Referring to FIGS. 2, 5A, 5B, 6A and 6B, the positioning member 110 may further have a first limiting portion 112 and a second limiting portion 113. The first limiting portion 112 and the second limiting portion 113 are adjacent to the positioning portion 111, and the positioning portion 111 may face the sliding member 200. Further, when the positioning end 121 is pressingly secured on the positioning portion 111 and the operation member 130 is located at the first limiting portion 112, the relative positions of the sliding member 200 and the positioning member 110 are fixed. During the process in which the operation member 130 departs from the first limiting portion 112 and slides to the second limiting portion 113, the operation member 130 pushes the elastic piece 120 and drives the positioning end 121 to depart from the positioning portion 111, allowing the sliding member 200 to slide linearly.

Referring to FIGS. 2 and 4 to 6B, the elastic piece 120 may further have a connecting section 123, which obliquely connects the immobile end 122 and the positioning end 121. The operation member 130 has a pushing portion 131, which is located at one side of the connecting section 123 close to the positioning member 110. During the process in which the operation member 130 slides from the first limiting portion 112 to the second limiting portion 113, the pushing portion 131 pushes the connecting section 123, such that the connecting section 123 moves towards a second direction D2 away from the positioning member 110 and drives the positioning end 121 to depart from the positioning portion 111, accordingly enabling the sliding member 200 to slide along the first direction D1 relative to the positioning member 110.

Referring to FIG. 2 to FIG. 5B, the positioning member 110 may further have a first side surface 114 and a second side surface 115. An operation sliding groove 116 is formed between the first side surface 114 and the second side surface 115, and the positioning portion 111 is provided in a recessed manner at the first side surface 114. The operation member 130 may further include a connecting portion 132 and an operation portion 133. The connecting portion 132 connects the operation portion 133 and the pushing portion 131, and is provided in the operation sliding groove 116. The operation portion 133 is located at the second side surface 115, and the pushing portion 131 is located at the first side surface 114. The first limiting portion 112 and the second limiting portion 113 are adjacent to the operation sliding groove 116. A user can push the operation portion 133 to slide the operation member 130 from the first limiting portion 112 to the second limiting portion 113, or from the second limiting portion 113 to the first limiting portion 112. Further, during the sliding process of the operation member 130, the connecting portion 132 slides along and in the operation sliding groove 116.

Referring to FIG. 2 to FIG. 5A, in this embodiment, for example but not limited to, the first limiting portion 112 and the second limiting portion 113 are provided at the second side surface 115, and the operation portion 133 of the operation member 130 may be correspondingly fastened with the first limiting portion 112 and the second limiting portion 113. In other embodiments, at least one of the first limiting portion 112 and the second limiting portion 113 may be selectively provided at the first side surface 114. When the first limiting portion 112 and/or the second limiting portion 113 are/is provided on the first side surface 114, the pushing portion 131 of the operation member 130 may be designed to fasten with the first limiting portion 112 and/or the second limiting portion 113.

Further, referring to FIGS. 4 to 6B, in this embodiment, for example but not limited to, the first limiting portion 112 and the second limiting portion 113 are indentations, and the operation portion 133 has a corresponding protrusion 133a corresponding to the indentations. In other embodiments, the first limiting portion 112 and the second limiting portion 113 may also be protrusions, whereas the operation portion 133 may be an indentation corresponding to the protrusions. Further, in this embodiment, the material of the operation portion 133 may be a flexible material, and the operation portion 133 has a first side edge 133b, a second side edge 133c, and a shrunk channel 133d formed between the first side edge 133b and the second side edge 133c. The first side edge 133b may be correspondingly fastened with the first limiting portion 112 and the second limiting portion 113. In other words, the first side edge 133b is provided with the indentations or the protrusion 133a correspondingly fastened with the first limiting portion 112 and the second limiting portion 113 as described above. Because the material of the operation portion 133 is a flexible material, when the shrunk channel 133d is retracted from the first side edge 133b towards a direction of the second side edge 133c (the dimensions of the shrunk channel 133d are reduced when retracted) such that the operation portion 133 of the operation member 130 is allowed to depart from the first limiting portion 112 or the second limiting portion 113, enabling the operation member 130 to slide between the first limiting portion 112 and the second limiting portion 113.

Referring to FIGS. 4, 5A and 5B, the operation member 130 may further include an anti-slide portion 134, which is provided on the operation portion 133. The anti-slide portion 134 may be, for example but not limited to, a protrusion, or may be an indentation. Further, the present invention does not limit to shape and material of the anti-slide portion 134.

Referring to FIGS. 1, 5B and 6B, in the latch mechanism 100 of the present invention, when the positioning end 121 of the elastic piece 120 is pressingly secured at the positioning portion 111, the sliding member 200 is blocked from slide linearly; when the operation member 130 pushes the elastic piece 120 and drives the positioning end 121 to depart from the positioning portion 111, the sliding member 200 can slide linearly. Therefore, the latch mechanism 100 of the embodiment is suitable for limiting the movement of the sliding member 200.

Referring to FIGS. 1, 2, 3, 5A and 5B, the latch mechanism 100 of the embodiment is applicable to an electronic device 300. The latch mechanism 100 of this embodiment applied to an electronic device 300 may be used in connection with the sliding member 200; that is to say, the latch mechanism 100 of the embodiment may include the sliding member 200. The electronic device 300 may include a battery installation portion 310 and a battery 320. The battery 320 is provided in the battery installation portion 310, and has a first fastening portion 321. The latch mechanism 100 is provided at the electronic device 300 and is adjacent to the battery installation portion 310. The sliding member 200 may include a second fastening portion 210 and a mounting portion 220, wherein the mounting portion 220 is adjacent to the second fastening portion 210. The second fastening portion 210 is adaptively fastened with the first fastening portion 321 to lock the battery 320 in the battery installation portion 310. The positioning member 110 is positioned correspondingly to the mounting portion 220, with the positioning portion 111 facing the mounting portion 220. The elastic piece 120 is provided between the mounting portion 220 and the positioning portion 110, and the immobile end 122 is provided on the mounting portion 220. Further, an accommodating groove 221 may be formed on the mounting portion 220 of the sliding member 200, the elastic piece 120 is provided in the accommodating groove 221, and the immobile end 122 is fixed on the mounting portion 220.

Referring to FIGS. 1, 2, 3, 5A and 5B, the electronic device 300 may further include a guide member 330, which is adjacent to the battery installation portion 310. The sliding member 200 may further include a sliding track 230. The sliding track 230 extends along the first direction D1, and the guide member 330 is placed and fitted in the sliding track 230. The sliding track 230 can slide along the first direction D1 or opposite to the first direction D1 relative to the guide member 330. The electronic device 300 may further include a first installation portion 340 and a second installation portion 350. The first installation portion 340 is connected between the battery installation portion 310 and the second installation portion 350, and extends along the first direction D1. An installation furrow 351 is formed on the second installation portion 350. The guide member 330 is provided at the first installation portion 340. The sliding member 200 may further include a central portion 240, which is connected between the second fastening portion 210 and the mounting portion 220. The guide track is provided at the central portion 240, the central portion 240 is provided in the first installation portion 340, the mounting portion 220 is provided in the second installation portion 350, and the positioning member 110 is insertingly provided in the installation furrow 351.

Figure 7A:
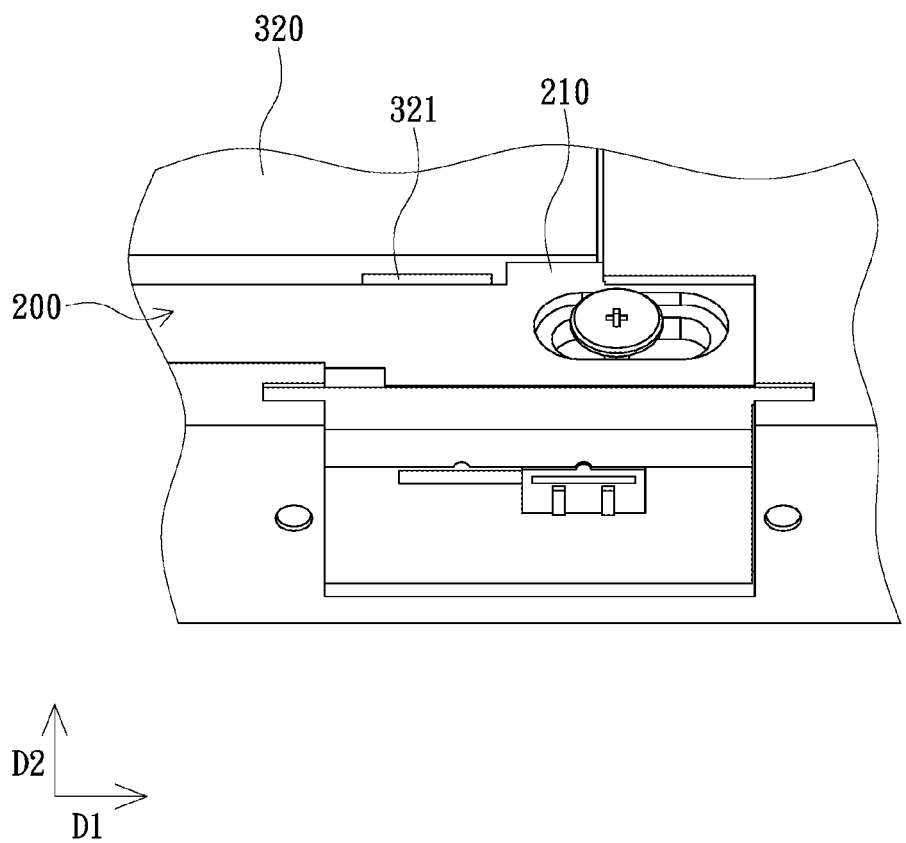
FIG. 7A is a second schematic diagram of a latch mechanism applied to an electronic device and being in an unlocked state according to an embodiment of the present invention.
Figure 7B:
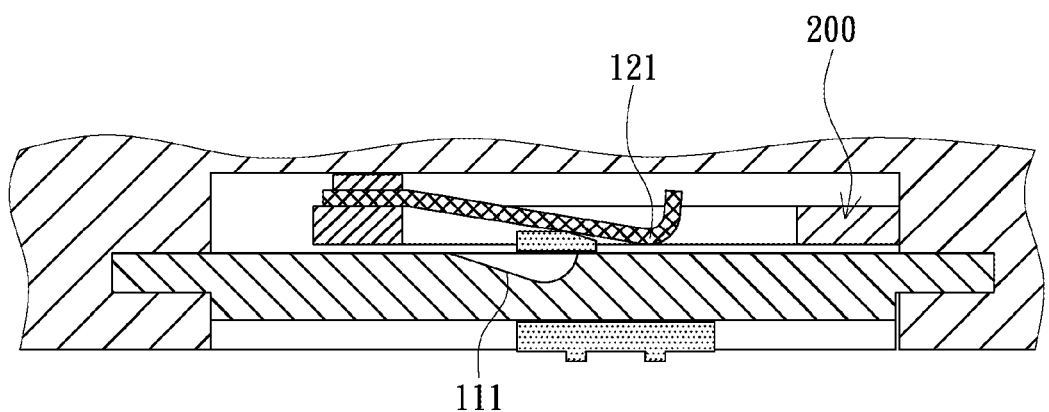
FIG. 7B is a top section diagram of FIG. 7A.
Figure 7B:
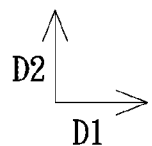

In sum, FIGS. 5A, 6A and 7A show a process in which the latch mechanism 100 changes from a locked state to an unlocked state. FIGS. 5B, 6B and 7B are top section diagrams corresponding to FIGS. 5A, 6A and 7A. Referring to FIGS. 2, 5A and 5B, the battery 320 is placed in the battery installation portion 310, the second fastening portion 210 presses on the first fastening portion 321 and is thus fastened with the first fastening portion 321, the positioning end 121 is pressingly secured on the positioning portion 111, and the operation member 130 is located at the first limiting portion 112. At this point, the latch mechanism 100 is in a locked state. In the locked state, because the positioning end 121 of the elastic piece 120 is pressingly secured on the positioning portion 111, even if the electronic device 300 encounters an impact or falls onto the ground, the sliding member 200 is incapable of linearly slide along the first direction D1 relative to the first fastening portion 321. Accordingly, even if the electronic device 300 encounters an impact or falls onto the ground, the second fastening portion 210 is kept in a fastened state with the first fastening portion 321, ensuring that the battery 320 does not depart from the battery installation portion 310.

Referring to FIGS. 2, 5A, 5B, 6A and 6B, to remove the battery 320 from the battery installation portion 310, the operation member 130 is caused to slide along the first direction D1 from the first limiting portion 112 to the second limiting portion 113. During the sliding process of the operation member 130, the pushing portion 131 pushes the connecting section 123 of the elastic piece 120, such that the connecting section 123 moves along the second direction D2 to become located away from the positioning member 110, and at the same time drives the positioning end 121 to depart along the second direction D2 from the positioning portion 111. Because the positioning end 121 is departed from the positioning portion 111, the sliding member 200 at this point is in a state of being slidable relative to the positioning member 110.

Referring to FIGS. 2, 6A, 6B, 7A and 7B, after the positioning end 121 is departed from the positioning portion 111, the sliding member 200 is enabled to slide along the first direction D1 relative to the positioning member 110. While the sliding member 200 slides along the first direction D1 relative to the positioning member 110, the second fastening portion 210 moves away from the top of the first fastening portion 321. As such, the battery 320 can then be removed from the battery installation portion 310.

Further, in this embodiment, the operation member 130 and the sliding member 200 both slide along the first direction D1; that is, an included angle between the sliding direction of the operation member 130 and the sliding direction of the sliding member 200 is 0°. In other words, the included angle between the sliding direction of the operation member 130 and the sliding direction of the sliding member 200 is not equal to, for example but not limited to, 90°. Because both of the operation member 130 and the sliding member 200 slide along the first direction D1, the pushing member 131 can continuously push the elastic piece 120 when the battery 320 departs from the battery installation portion 310 and the operation member 130 is kept at the second limiting portion 113, such that the positioning end 121 is kept as separated from the positioning portion 111, thereby facilitating the installation of the battery 320 back to the battery installation portion 310.

When the latch mechanism 100 of the embodiment is used for locking the battery 320 of the electronic device 300, the battery 320 needs to be in a state in which the sliding member 200 is slidable in order to be removed from the battery installation portion 310 of the electronic device 300. Further, in the latch mechanism 100 of this embodiment, the operation member 130 needs to slide on the positioning member 110 in order to push the elastic piece 120 to allow the positioning end 121 of the elastic piece 120 to depart from the positioning portion 111 of the positioning member 110, and to further allow the sliding member 200 to slide. Therefore, when the electronic device 300 encounters an impact or falls onto the ground, the battery 320 does not depart from the battery installation portion 310 because the positioning end 121 is pressingly secured at the positioning portion 111 and the sliding member 200 is not slidable.

In conclusion, the latch mechanism of the present invention ensures that the battery is not separated from the electronic device due to an impact or falling off of the electronic device, thereby preventing the issue of interrupted power supply caused by an accidental disengagement of the battery, as well as effectively reducing the risk of damaging the operation system or data and ensuring the system and data safety during the operation of the electronic device.

While the invention has been described by way of example and in terms of the preferred embodiments, it is to be understood that the invention is not limited thereto. Various modifications and similar arrangements and procedures made by a person skilled in the art without departing from the spirit of the present invention are encompassed within the scope of the present invention, and the scope of the present invention therefore should be accorded with the broadest interpretation of the appended claims. Further, the terms "first" and "second" throughout the application or claims are only for naming components or distinguishing different embodiments and scopes, and are not to be construed as limiting an upper limit or a lower limit of quantities of the components.

What is claimed is:

1. A latch mechanism, comprising:
   a sliding member;
   an elastic piece, having a positioning end and an immobile end fixed at the sliding member;
   a positioning member, having a positioning portion, wherein the positioning end is pressingly secured at the positioning portion to block a linear sliding movement of the sliding member; and
   an operation member, provided at the positioning member;
   wherein, the operation member is slid to push the elastic piece and drive the positioning end to depart from the positioning portion, further allowing the linear sliding movement of the sliding member.

2. The latch mechanism according to claim 1, wherein an included angle between a sliding direction of the operation member and a sliding direction of the linear sliding movement of the sliding member is not equal to 90°.

3. The latch mechanism according to claim 1, wherein the elastic piece further has a connecting section obliquely connecting the immobile end and the positioning end, the operation member has a pushing portion that is located at one side of the connecting section close to the positioning member, and the operation member is slid to enable the pushing portion to push the connecting section of the elastic piece and to drive the positioning end to depart from the positioning portion, further allowing the linear sliding movement of the sliding member.

4. The latch mechanism according to claim 1, wherein the positioning member further has a first limiting portion and a second limiting portion, the first limiting portion and the second limiting portion are adjacent to the positioning portion, and the operation member departs from the first limiting portion and slides to the second limiting portion to push the elastic piece and to drive the positioning end to depart from the positioning portion, further allowing the linear sliding movement of the sliding member.

5. The latch mechanism according to claim 1, wherein the sliding member further comprises an accommodating groove, in which the elastic piece is provided.

6. A latch mechanism, suitable for limiting a movement of a sliding member, the latch mechanism comprising:
   a positioning member, having a positioning portion, a first limiting portion and a second limiting portion, the positioning portion facing the sliding member, the first limiting portion and the second limiting portion being adjacent to the positioning portion;
   an elastic piece, having an immobile end, a positioning end, and a connecting section obliquely connecting the immobile end and the positioning end, the immobile end being provided on the sliding member; and
   an operation member, provided on the positioning member, the operation member having a pushing portion, the pushing portion being located at one side of the connecting section close to the positioning member;
   wherein, the positioning end is pressingly secured on the positioning portion and the operation member is located at the first limiting portion, such that relative positions of the sliding member and the positioning member are fixed;
   when the operation member slides from the first limiting portion to the second limiting portion, the pushing portion pushes the connecting section, such that the connecting section moves towards a direction away from the positioning member and drives the positioning end to depart from the positioning portion, enabling the sliding member to slide relative to the positioning member.

7. The latch mechanism according to claim 6, wherein an included angle between a sliding direction of the operation member and a sliding direction in which the sliding member slides relative to the position member is not equal to 90°, wherein the sliding direction of the operation member is between the first limiting portion and the second limiting portion.

8. The latch mechanism according to claim 6, wherein the sliding member further comprises an accommodating groove, in which the elastic piece is placed.

9. A latch mechanism, suitable for locking a battery of an electronic device in a battery installation portion of the electronic device, the battery having a first fastening portion, the latch mechanism comprising:
a sliding member, having a second fastening portion and a mounting portion, the second fastening portion fastened with the first fastening portion to lock the battery in the battery installation portion, the mounting portion being adjacent to the second fastening portion;
a positioning member, positioned correspondingly to the mounting portion, having a positioning portion, a first limiting portion and a second limiting portion, the positioning portion facing the mounting portion, the first limiting portion and the second limiting portion being adjacent to the positioning portion;
an elastic piece, provided between the mounting portion and the positioning member, having an immobile end, a positioning end and a connecting section obliquely connecting the immobile end and the positioning end, the immobile end provided on the mounting portion; and
an operation member, provided on the positioning member, the operation member having a pushing portion, the pushing portion located at one side of the connecting section close to the positioning member;
wherein, the positioning end is pressingly secured on the positioning portion and the operation member is located at the first limiting portion, such that relative positions of the first limiting portion and the second limiting portion are fixed; when the operation member slides from the first limiting portion to the second limiting portion, the pushing portion pushes the connecting section, such that the connecting section moves towards a direction away from the positioning member and drives the positioning end to depart from the positioning portion, enabling the sliding member to slide relative to the positioning member and the second fastening portion to depart from the first fastening portion.

10. The latch mechanism according to claim 9, wherein an included angle between a sliding direction of the operation member and a sliding direction in which the sliding member slides relative to the position member is not equal to 90°, wherein the sliding direction of the operation member is between the first limiting portion and the second limiting portion.

11. The latch mechanism according to claim 9, wherein an accommodating groove is formed on the mounting portion of the sliding member, and the elastic piece is placed in the accommodating groove.

* * * * *